United States Patent

Moisand et al.

[15] 3,651,379

[45] Mar. 21, 1972

[54] TEMPERATURE RESPONSIVE CIRCUIT FOR PROTECTING AN ELECTRON DEVICE

[72] Inventors: Brian H. Moisand, Chicago; William A. Schilb, Lombard, both of Ill.

[73] Assignee: Motorola, Inc., Franklin Park, Ill.

[22] Filed: Oct. 30, 1970

[21] Appl. No.: 85,427

[52] U.S. Cl. ........................317/41, 317/33 SC, 317/33 VR, 330/23, 330/207 P, 307/202, 323/69

[51] Int. Cl. ..........................................H02h 5/04, H02h 7/20

[58] Field of Search ..............317/41, 33 SC, 33 VR; 323/68, 323/69; 320/35; 307/202; 330/23, 207 P

[56] References Cited

UNITED STATES PATENTS 3,480,852 11/1969 Han-Min Hung ....................323/68 X 3,566,200 2/1971 Seidler .................................323/68 X 3,522,480 8/1970 Routh .................................317/41 X

*Primary Examiner*—J. D. Miller

*Assistant Examiner*—Harvey Fendelman

*Attorney*—Mueller and Aichele

[57] ABSTRACT

The protection circuit for an electron device includes a silicon controlled rectifier (SCR) selectively triggered by a voltage divider including first and second thermistors. The first thermistor monitors the temperature of a heat sink which is thermally connected with the device, and the second thermistor monitors the ambient temperature. When the sink and ambient temperatures indicate the device is about to overheat, the divider provides a voltage which triggers the SCR to change the bias thereby decreasing the power level of the device. The temperature of the device decreases in response to the decrease in power level. The protection circuit can be used with the power amplifier of a radio transmitter wherein the energizing circuit of the SCR is broken each time the transmitter is keyed to reset the protection circuit.

10 Claims, 3 Drawing Figures

INVENTORS
BRIAN H. MOISAND
WILLIAM A. SCHILB
BY Mueller & Aichele
ATTYS.

TEMPERATURE RESPONSIVE CIRCUIT FOR PROTECTING AN ELECTRON DEVICE

BACKGROUND OF THE INVENTION

Electron control devices, such as transistors and vacuum tubes, are often required to control or amplify large amounts of voltage and current. Even though such devices are connected to operate in an efficient mode, e.g., class B, the maximum theoretical efficiency thereof is still usually substantially less than 100 percent. For instance, the maximum theoretical collector or plate circuit efficiency of a transistor or tube connected to operate class B, with a sinusoidal driving signal applied thereto, is 78 percent. Therefore, in such circuits at least 22 percent of the total applied electrical power is converted into heat by the device which tends to increase the temperature thereof, unless the heat is properly dissipated through a heat sink by forced air cooling, etc. If such heat is not properly dissipated, or other protective measures taken, the increase in temperature may destroy or permanently damage the electron device.

In some applications, it is undesirable to use known power or heat dissipation apparatus to protect electron control devices because such power dissipation apparatus takes up too much space or is otherwise unsuitable for a particular application. For instance, a compact transistor transceiver may include a transmitter with an output transistor which is intentionally operated at a level near its maximum rated power dissipation level to provide a high power output signal. Because of the lack of space in the unit, large heat sinks can not be employed. Moreover, because of the possibilities of mistuning of the output network for the transmitter, the induced voltages from other transmitters and for other reasons, it is not possible to accurately compute the amount of heat power developed by the transistor which must be dissipated. Under these conditions it is desirable to indirectly sense the junction temperature of the output transistor and decrease the amplitude of its output signal as the junction temperature approaches a predetermined maximum value. The temperature of the transistor will tend to decrease as its output signal decreases because the amount of power dissipated by the transistor decreases.

In the past, a transistor protection circuit employing a thermistor has been utilized for sensing the temperature of a heat sink associated with an output transistor and for gradually changing the bias on a control transistor in response thereto. As a result of its bias change, the control transistor varies the magnitude of the collector voltage of a driver stage thereby changing the amplitude of the signal being applied to the output transistor. This controls the amplitude of the output signal and, hence, the temperature of the output transistor. The monitored heat sink temperature, however, does not give a true indication of the junction temperature because of the thermal capacity of the heat sink. This is especially true if the heat sink is located in a closed container such as a portable radio housing. Therefore, the foregoing protective scheme may not be suitable for use over the wide range of ambient temperatures to which portable electronic equipment is subjected. As a result, the prior art transistor protection circuit might undesirably decrease the amplitude of an amplifier at either high or low ambient temperature ranges. Moreover, the foregoing prior art circuit is relatively complex thereby increasing the weight, space, cost and failure probability of electronic systems with which it is used.

SUMMARY OF THE INVENTION

One object of the invention is to provide a compact, inexpensive and lightweight temperature responsive circuit for protecting an electron control device.

Another object of this invention is to provide a protection circuit for a semiconductor electron control device, having a heat sink thermally connected therewith, which is responsive to both the ambient and sink temperatures.

Still another object of the invention is to provide a temperature responsive protection circuit for an electron control device which allows the device to provide an output signal of maximum amplitude until the device reaches a critical temperature whereat the amplitude of the output signal is reduced.

A further object of the invention is to provide a protection circuit for a power transistor in the power amplifier of a radio transmitter, which uses a silicon controlled rectifier for reducing the power dissipated by the transistor when the temperature of the transistor exceeds the desired limits, and wherein the protection circuit is reset each time the transmitter is keyed.

A still further object of the invention is to protect a transistor from heat damage over a wide ambient temperature range especially when a heat sink associated with the transistor is not aided in its head dissipating function by an air flow.

In brief, the present invention relates to a protection circuit for changing the required power dissipation level, thereby changing the temperature of an electron control device in response to both the temperature of a heat dissipating structure associated with the device and the ambient temperature of the device. The temperature of the electron control device depends on the amplitude of its output signal which is a function of the magnitude of a bias level. The protection circuit includes a silicon controlled rectifier (SCR) having its anode coupled to a power supply and its cathode connected to the point at which the bias level is developed. First and second thermistors are electrically connected between the power supply and a reference potential thereby forming a voltage divider. The junction between the thermistors is coupled to the gate of the SCR. The first thermistor is thermally connected to the heat sink for the electron control device and the second thermistor is positioned so that it senses the ambient temperature adjacent the device. The resistance of the first thermistor has a greater rate of change with temperature than the resistance of the second thermistor and both thermistors have negative temperature coefficients. The temperature of the electron control device is a function of the heat sink and ambient temperatures. The resistances of the first and second thermistors are respectively controlled by change in the temperatures of the sink and the ambient such that when the temperature of the electron control device reaches an excessive or critical value, a threshold voltage is applied to the gate of the SCR to render the SCR conductive. A portion of the power supply voltage is then conducted through the SCR to change the bias level and reduce the amplitude of the output signal of the device. This reduction in output enables the temperature of the device to decrease. The invention can be used to protect the transistor of the power amplifier of a radio transmitter, and the SCR can be reset each time the transmitter is keyed to restore the power in the event the temperature has dropped to a safe level.

DETAILED DESCRIPTION OF THE PREFERRED EMBODIMENT

Figure 1:
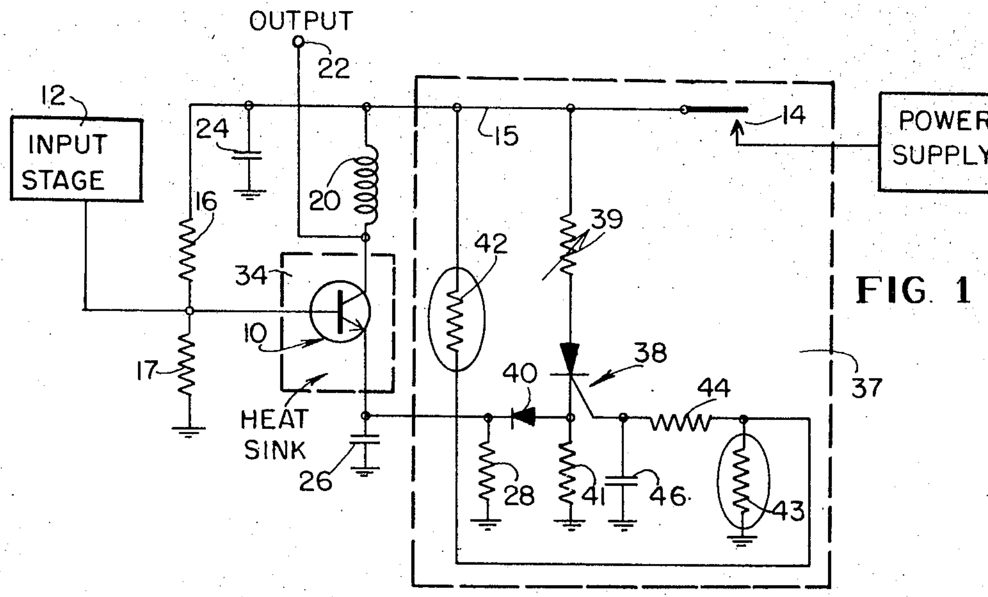
FIG. 1 is a schematic diagram of a control circuit of one embodiment of the invention suitable for use with a single amplifier stage.

Referring to FIG. 1, a NPN radio frequency (RF) power output transistor 10 is shown which cooperates with circuit components connected thereto, which may include an oscillator, a modulator and a driver amplifier to form a radio frequency transmitter. Input stage 12 which may include the driver amplifier of the transmitter is connected to the base of transistor 10 and applies a driving signal thereto. Power supply 13 is connected through switch 14 to bias conductor 15. Bias resistors 16 and 17 are connected in series with each other between conductor 15 and a reference or ground potential. These bias resistors form a voltage divider which supplies a fixed base-to-emitter bias voltage to transistor 10. The collector of transistor 10 is coupled through RF choke 20 to conductor 15 and to output terminal 22. RF choke 20 tends to isolate conductor 15 from RF signals being developed at the collector of transistor 10. Capacitor 24 is connected from conductor 15 to the reference potential and provides a low impedance path to the reference potential for RF signals passing through RF choke 20 or otherwise being applied to conductor 15. The emitter of transistor 10 is coupled to the reference potential through bypass capacitor 26 and resistor 28.

The values of resistors 16, 17 and 28 may be chosen such that the quiescent bias point of transistor 10 is near cutoff thus causing the amplifier stage to operate class B, thereby facilitating high efficiency. The polarity of the potential developed across resistor 17 tends to forward bias the base-to-emitter junction of transistor 10 whereas the polarity of the voltage drop across resistor 28 tends to reverse bias the base-to-emitter junction. The difference between the potentials across resistor 17 and resistor 28 determines the base-to-emitter bias voltage across transistor 10 and, hence, its operating point.

Assuming that input stage 12 applies a sinusoidal input signal to the base of class B operated transistor 10, collector current flows through the transistor during the positive going portions of alternate half cycles of the input signal. As transistor 10 is rendered conductive, the current through it increases and the voltage between its collector and emitter decreases. The instantaneous amount of power which must be dissipated by transistor 10 is approximately equal to the instantaneous voltage between its collector and emitter multiplied by the current passing therethrough. This power is converted to heat within the transistor and tends to increase the temperature of the junctions thereof. If transistor 10 is a silicon transistor the junctions may be permanently damaged if they reach temperatures in excess of 200° centigrade (C.) for more than a few milliseconds.

Figures 2, 3:
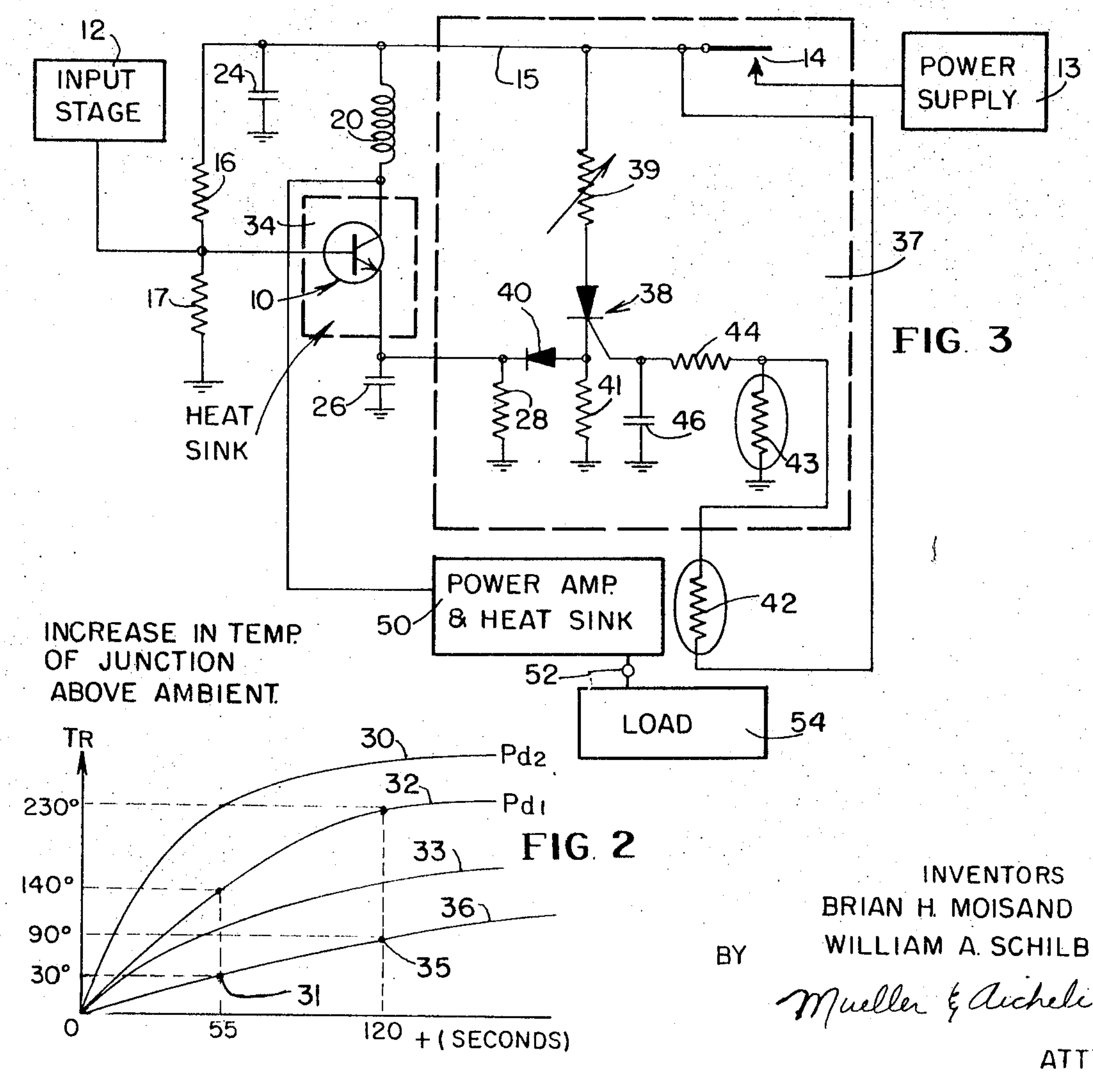
FIG. 2 is a family of curves showing temperature rise above ambient versus time as functions of different power dissipation levels for a transistor junction.
FIG. 3 is a partial block and schematic diagram of the signal control circuit of the invention used with an amplifier having two cascaded stages.

To prevent the temperature of transistor 10 from rising above its critical value, a heat sink 34 is "thermally connected" thereto. A "thermal connection" is defined to be a connection which conducts heat but does not necessarily conduct electrical current. More particularly, a thermally conductive material such as mica coated with silicon grease may be placed between the case of transistor 10 and the heat sink. This forms a connection therebetween which is an insulator to electrical current but a conductor of heat. The amount of steady state heat power which can be dissipated by this structure without causing the temperature of the junction to increase is expressed by the following equation:

$$P_d = (T_j - T_a)/\Theta_t \quad (1)$$

wherein:

$P_d$ = power being dissipated $\Theta_t$ = total thermal resistance between the junction and the ambient $T_j$ = junction temperature $T_a$ = ambient temperature In the foregoing equation, the thermal resistance is a constant and the junction and ambient temperatures are variables. Hence, the junction temperature is a function of the ambient temperature and the amount of power dissipated. A more general expression, which includes the transient temperature response preceding the steady state value of junction temperature is given by the following relationship:

$$T_R = P_d \Theta_t (1 - E^{-t}/m\Theta_t) \quad (2)$$

wherein:

$T_R$ = increase in temperature of junction above $T_a$ $t$ = time in seconds $m$ = effective mass of the thermal system The relationships expressed by equation (2) are graphically illustrated in FIG. 2 by junction temperature above ambient curves 30 and 32 for two different values of power dissipation ($P_d$). Each of curves 30 and 32 is composed of the summation of the heat sink temperature above ambient and junction temperature above heat sink responses. These latter curves are denoted by an expression of the same form expressed by equation (2). For example, curve 32 of FIG. 2 is comprised of the sum of junction above heat sink curve 33 and heat sink above ambient curve 36.

Although it is desired to control the junction temperature of the transistor it is impractical to measure the junction temperature directly. Hence, control temperatures could be sensed at the case, sink or ambient positions. A computer simulation of an actual mechanical-thermal system similar to the one depicted in FIG. 1, shows that at an ambient temperature of −30° C., the transistor junction reaches +200° C. ($T_R$= 230°) at a heat sink temperature below +60° C. ($\Delta T$=90°), in about 120 seconds (see point 35 on curve 36 of FIG. 2). However, at an ambient temperature of +60° C., the transistor junction reaches a temperature of +200° C., ($T_R$=140°) when the heat sink temperature reaches approximately +90° C. ($\Delta$T=40) in about 55 seconds (see point 31 on curve 36 of FIG. 2). Hence, the transistor could be damaged at a heat sink temperature of 60° C., at an ambient of −30° C., whereas it would not be damaged until the heat sink temperature reached 90° C. at an ambient of +60° C. if required to dissipate a particular quantity of power. Therefore, it is necessary to monitor both the ambient and the heat sink temperatures in order to protect a power transistor which is subjected to a wide range of temperatures.

Enclosed in block 37 of FIG. 1 is the control or protection circuit of one embodiment of the invention including a normally nonconductive device or silicon controlled rectifier (SCR) 38 having its anode connected through potentiometer 39 to conductor 15, and its cathode connected through diode 40 to resistor 28 and through resistor 41 to a reference potential. Diode 40, which is normally reverse biased, isolates the gate cathode junction of SCR 38 from voltage changes across resistor 28. Thermistors 42 and 43 are connected in series between conductor 15 and the reference potential thereby forming a voltage divider. Resistor 44 connects one end of thermistor 43 to the gate of SCR 38. Capacitor 46 is connected from one end of resistor 44 to the reference potential.

Thermistor 42 is thermally connected to heat sink 34 or, if possible, to the case of transistor 10, so that it can sense the temperature of the case or sink. Thermistor 43 is located neat heat sink 34 so that it can sense the ambient temperature thereof. Both thermistors have negative temperature coefficients so that the resistance thereof decreases as the temperature increases. Thermistor 42 has a lower thermal capacity than thermistor 43, so that its rate of change of resistance with temperature is greater than that of thermistor 43.

The junction temperature of transistor 10 and, hence, the case or sink temperature increases more rapidly than the ambient temperature. Thus, as the ambient temperature increases a given sink temperature indicates increasingly lower values of junction temperature. As the junction temperature increases, the resistance of thermistor 42 decreases more rapidly than the resistance of thermistor 43, thereby causing proportionately more of the voltage from power supply 13 to be developed across thermistor 43 even though its resistance is also decreasing in response to the increasing ambient temperature. Therefore, thermistors 42 and 43 enable correspondingly higher values of sink temperature to trigger SCR 38 as the ambient temperature increases.

As the voltage builds up across thermistor 43 it eventually reaches a threshold value, in correspondence to the junction temperature of transistor 10 reaching a critical value, e.g., 200° C., which causes SCR 38 to fire or be rendered conductive. The power supply voltage is then divided between potentiometer 39, the junction of SCR 38, and resistor 41. The voltage across resistor 41 is developed across diode 40, thereby forward biasing it, and across resistor 28. The increased voltage across bias resistor 28 tends to reverse bias transistor 10 thereby shifting its operating point forcing it to operate in or deeper into a class C mode. This reduces the amplitude of the output voltage and current a predetermined amount which is controlled by the relative values of potentiometer 39 and resistor 41. Hence, potentiometer 39 enables adjustment of the voltage conducted by SCR 38 to resistor 41 thereby causing a selected amounted of temperature control for transistor 10 in response to a selected junction temperature. A decrease in output of transistor 10 decreases the voltage and current developed thereacross, thereby decreasing its required power dissipation which allows the temperature of the transistor to decrease.

The time constant of resistor 44 and capacitor 46 prevent SCR 36 from being triggered by electrical transients which might otherwise occur at the gate thereof. The resistance versus temperature coefficients of thermistors 42 and 43 can be selected to provide many different temperature responsive characteristics to meet the demands of a variety of conditions. For instance, the temperature characteristic of thermistor 43 may be selected to counter-balance the tendency of the gate-cathode firing voltage of SCR 38 to change with temperature by varying the triggering voltage amplitude in correspondence to changes in the ambient temperature.

After SCR 38 has been fired, transistor 10 operates at a reduced output level until the contacts of switch 14, which may be the push-to-talk switch of a transmitter, are opened to reset SCR 38, and then closed. However, even though SCR 38 is reset by switch 14, the full output will be initiated only if transistor 10 has cooled to a sufficiently low temperature as evidenced by its heat sink and ambient temperature so that a triggering voltage is not developed across thermistor 43. Since in normal operation, switch 14 will be frequently operated, low power operation will not continue for a long time period after the temperature of transistor 10 drops to a safe level.

Referring now to FIG. 3, the electron control protection circuit 37 of FIG. 1 is shown in an adapted form for use with an amplifier having cascaded stages. Reference numerals for corresponding components of FIG. 1 have been used in FIG. 3. In FIG. 3 output terminal 22 of the previously described amplifier including transistor 10 is connected to the input of amplifier 50, which is shown in block form. Amplifier 50 may be an RF amplifier similar to the amplifier which includes transistor 10. Output terminal 52 of amplifier 50 is connected to a load 54 which may be an antenna. Thermistor 42 has been placed in thermal connection with the heat sink associated with power amplifier 50.

The circuitry of FIG. 3 operates in a manner similar to the operation of the circuitry of the previously described circuit of FIG. 1, except that thermistor 42 senses the temperature of the heat sink associated with the power amplifier 50 rather than the temperature of heat sink 34 associated with transistor 10. When the combination of the temperature of heat sink 50, as sensed by thermistor 42 and the ambient temperature, as sensed by thermistor 43 indicates that the junction temperature of the electron control device of amplifier 50 is at a critical value, SCR 38 fires causing a reduced output from transistor 10. The reduced output from transistor 10 provides a reduced drive signal to amplifier 50 thereby decreasing the amplitude of the output of amplifier 50 so that the temperature of the electron control element thereof can decrease.

Although the structure and function of protection or control circuit 37 of the above described embodiments of the invention has been explained in connection with RF amplifier stages, it will be apparent to one skilled in the art that the particular configuration of the amplifier being controlled is not determinative. For example, the control circuit of FIG. 1 could be used with an audio output stage, and the control circuit of FIG. 3 could be used with cascaded audio stages. Moreover, although transistor 10 was described in FIG. 1 as operating class B, it would also be apparent that transistor 10 could be operating class A in FIG. 3, provided that power amplifier stage 50 was operating either class B or class C. Furthermore, the control circuit could be used with vacuum tubes.

What has been described, therefore, is a compact, reliable and inexpensive protection circuit for use with electron control devices. The protection circuit senses and responds to both the ambient temperature and the temperature of a heat dissipating structure, associated with the device being protected, to provide protection over a wide range of temperatures. Furthermore, since the protection circuit does not reduce the amplitude of the output signal of the device being monitored until a critical temperature is reached, the output of the device is maintained at a high level for a maximum amount of time without causing damage to the device. Also, when used with a radio transmitter which is keyed at short intervals, the SCR circuit is frequency reset so that the power level is restored, if the controlled device is operating within the desired temperature limits.

We claim:

1. A control circuit for controlling an amplifier including an electron device and a heat dissipating structure associated with the device in response the temperature of the heat dissipating structure and the ambient temperature, the temperature of the device depending on the magnitude of a bias level applied to the amplifier, such control circuit including in combination:

a normally nonconductive device having first, second and third electrodes and being rendered conductive in response to a control voltage of a given magnitude applied to said second electrode;

first circuit means applying a supply voltage to said first electrode of said device;

second circuit means coupling said third electrode of said normally nonconductive device to the amplifier;

first temperature sensitive resistance means having first and second ends and a body which is thermally connected to the heat dissipating structure associated with the electron device for sensing the temperature thereof;

third circuit means applying said supply voltage to said first end of said first temperature sensitive resistance means, second temperature sensitive resistance means having a body positioned to sense the ambient temperature, a first and connected to said second end of said first temperature sensitive resistance means and a second end connected to a reference potential;

fourth circuit means connecting said first end of said second temperature sensitive resistance means to said second electrode of said normally nonconductive electron device; and said first and second temperature sensitive resistance means cooperating to develop a control voltage across said second temperature sensitive resistance means, said normally nonconductive electron device being rendered conductive by said control voltage exceeding a given magnitude to apply a portion of said supply voltage to the amplifier to change said bias level to thereby control the temperature of the electron control device.

2. The control circuit of claim 1 wherein said normally nonconductive device is a silicon controlled rectifier, and said first, second and third electrodes are respectively the anode, gate and cathode thereof.

3. The control circuit of claim 1 wherein said first circuit means includes a power supply providing a supply voltage at its output and a potentiometer connected between said output of said power supply and said first electrode of said normally nonconductive device.

4. The control circuit of claim 1 wherein said second circuit means includes a diode having first and second terminals, said first terminal of said diode being connected to said third electrode of said normally nonconductive device and said second terminal of said diode being connected to the amplifier, said diode isolating said third electrode of said normally conductive device from changes in the bias level occurring in the amplifier.

5. The control circuit of claim 1 wherein said first and second temperature sensitive resistance means are respectively first and second thermistors each having negative temperature coefficients, said second thermistor having more thermal capacity than said first thermistor.

6. The control circuit of claim 1 wherein said fourth circuit means includes a resistor means having a first end connected to said first end of said second temperature sensitive resistance means and a second end;

filter capacitor means having a first plate connected to said reference potential and a second plate connected both to said second end of said resistor means and to said second electrode of said normally nonconductive electron device; and said resistor means and filter capacitor means suppressing transients possibly occurring at said first end of said second temperature sensitive resistance means so that said transients cannot render said normally nonconductive device conductive.

7. In a radio frequency amplifier having first and second cascaded stages wherein the temperature of the electron control device of the second stage varies with a bias potential developed across a component of the first stage, the electron control device of the second stage having a heat dissipating structure associated therewith, a control circuit for controlling the temperature of the electron control device of the second stage including in combination:

normally nonconductive device having first, second and third electrodes and being rendered conductive in response to control voltage of a given magnitude applied to its second electrode;

power supply means providing a supply voltage at its output;

first circuit means connected from said output of said power supply means to said first electrode of said normally nonconductive device;

second circuit means coupling said third electrode of said normally nonconductive device to the component of the first stage;

first temperature sensitive resistive means having first and second ends and a body which is thermally connected to and senses the temperature of the heat dissipating structure associated with the electron control device of the second stage, said first end of said first temperature resistive means being connected to said output of said power supply means;

second temperature sensitive resistive means having a body positioned to sense the ambient temperature near the heat dissipating structure, a first end connected to said second end of said first temperature sensitive resistive means and a second end connected to a reference potential;

third circuit means connecting said first end of said second temperature sensitive resistive means to said second electrode of said normally nonconductive device;

said first and second temperature sensitive resistive means cooperating to develop said control voltage across said second temperature sensitive resistive means, said normally nonconductive device being rendered conductive by said control voltage exceeding said magnitude to apply a portion of said supply voltage to the component thereby changing the bias potential, the temperature of the electron control device of the second stage changing in response to said change in the bias potential.

8. The combination of claim 7 wherein said first circuit means includes a potentiometer having an adjustable resistance, said resistance being adjusted so that the bias potential across the component shifts a predetermined amount in response to said normally nonconductive device being rendered conductive.

9. The combination of claim 7 wherein said normally nonconductive device is a silicon controlled rectifier, and said first, second and third electrodes are respectively the anode, gate and cathode thereof.

10. The combination of claim 9 wherein said first circuit means includes a switch means for interrupting the current flow through said silicon controlled rectifier so that said silicon controlled rectifier can be reset to its nonconductive state after it has been rendered conductive and after the temperature of the electron control device of the second stage has decreased.

* * * * *